United States Patent [19]

Lapeyre

[11] Patent Number: 5,008,847
[45] Date of Patent: Apr. 16, 1991

[54] CURSOR SELECTED KEYBOARD KEYS DISPLAYED ON THE COMPUTER SCREEN FOR ENTERING ALPHANUMERIC CHARACTERS AND INSTRUCTIONS, PARTICULARLY FOR CREATING COMPUTER AIDED DESIGN AND DRAFTING PATTERNS

[75] Inventor: James M. Lapeyre, New Orleans, La.

[73] Assignee: The Laitram Corporation, New Orleans, La.

[21] Appl. No.: 60,225

[22] Filed: Jun. 10, 1987

Related U.S. Application Data

[63] Continuation-in-part of Ser. No. 844,872, Mar. 27, 1986, abandoned, which is a continuation-in-part of Ser. No. 459,998, Jan. 21, 1983, Pat. No. 4,547,860.

[51] Int. Cl.[5] ............................................. G06F 3/023
[52] U.S. Cl. ........................... 364/709.16; 364/209.15
[58] Field of Search .............. 364/709, 709.16, 709.15; 340/712, 710

[56] References Cited

U.S. PATENT DOCUMENTS 3,967,273 6/1976 Knowlton ............................ 364/709
4,451,895 5/1984 Sliwkowski ......................... 340/712
4,587,520 5/1986 Astle ................................... 340/712

Primary Examiner—David H. Malzahn
Attorney, Agent, or Firm—Laurence R. Brown

[57] ABSTRACT

The conventional keyboard is replaced by a virtual keyboard pattern on the computer screen by this invention. Selection of keystrokes is made by a mouse, or the like, positioning a cursor at a desired key for keyswitch selection. This manner of selection of pre-formed patterns available from the computer, such as alphanumeric characters and computer commands is particularly advantageous in a computer aided drafting and design system. Thus, notations and lettering need not be formulated by analog movement of the mouse, but can be selected digitally from the computer store by keyswitching. The resulting equipment therefor eliminates the conventional keyboard but not its operational advantages thereby permitting full computer operation with a mouse or the equivalent. Several features of the invention are provided for more convenient and more rapid operation, such as the replacement of the keyboard arrays as the computer changes modes of operation, and the placement of more frequently used keystrokes on the keyboard arrays for selection by minimized movements of the mouse.

4 Claims, 8 Drawing Sheets

FIG. 3

CURSOR SELECTED KEYBOARD KEYS DISPLAYED ON THE COMPUTER SCREEN FOR ENTERING ALPHANUMERIC CHARACTERS AND INSTRUCTIONS, PARTICULARLY FOR CREATING COMPUTER AIDED DESIGN AND DRAFTING PATTERNS

TECHNICAL FIELD

This is a continuation-in-part of my copending U.S. patent application, Ser. No. 844,872, filed Mar. 27, 1986 for Keyboard Located Indicia for Instructing a Multimode Programmable Computer having Alphanumeric Capabilities from a Few Keyboard Keys now abandoned, and incorporates that application hereinto by reference in its entirety together with its copending parent case U.S. patent application Ser. No. 729,559 filed May 2, 1985 for Programmable Computer with Alphanumeric Capabilities Having Few Keyboard Keys now abandoned. Each said case is a continuation-in-part of U.S. patent application Ser. No. 459,998, filed Jan. 21, 1983, now U.S. Pat. No. 4,547,860, Oct. 15, 1985 for Computer Keyboards with Few Keys Designating Hundreds of Functions.

This invention relates generally to manual entry into multi-purpose programmable computers of instructions and alphanumeric characters. More specifically it relates to keyboard arrays of few keys for controlling a large number of manual entries in computer embodiments such as computer aided drafting and design systems to thereby produce alphanumeric notations and computer commands. A feature of this invention is the replacement of a typewriter like keyboard by a virtual keyboard displayed on a computer screen for operation by cursor selection from a manually operated mouse, puck, joystick, or the like.

BACKGROUND ART

At the present state of the computer art, multi-purpose computers capable of alphanumeic data processing necessitate manual entry of alphanumeric characters and operating instructions by means of typewriter-like keyboards.

In my hereinbefore defined keyboard cases, a few keys such as twelve or sixteen, are employed with a mode of computer operation to enter characters or instructions in response to two (or more) successive keystrokes, thereby to produce more than a hundred entries from the few keys. In my U.S. Pat. No. 4,547,860 such keyboards are supplied with self-contained indicia that identifies the large number of computer input selections available without reference to instruction manuals for programming codes, or the like.

Computer systems are also known for aiding design and drafting of various pattern configurations under control of manual cursor control means such as a mouse or joystick. However in these systems, it is awkward and time consuming to enter identifying alphanumeric information. Also the amount of computer equipment is proliferated by requiring both a keyboard and a cursor control mouse or the like. It has not been known in this art how to simply control computer commands and entry of pre-formed alphanumeric input characters by means of a mouse, or the like, without an additional keyboard.

It is therefore an object of this invention to produce a more efficient computer system operable without a typewriter-like keyboard.

It is a further object of this invention to produce a more effective computer aided drafting and design system that simply and quickly enters pre-determined commands and pre-formed alphanumeric characters and other patterns into desired locations on a computer formulated display. Other objects, features and advantages of the invention will be found throughout the following specification, claims and drawings.

DISCLOSURE OF THE INVENTION

This invention provides for the display of a virtual keyboard array on the screen of a computer to replace a conventional typewriter-like keyswitch array on a keyboard for the entry of computer commands and preformed patterns such as alphanumeric characters. Each input entry normally produced by a keyboard is rather by this invention manually selected by means of analog cursor control means, such as a mouse, which positions the cursor at a selected key on a virtual keyboard location on the computer screen and produces a keystoke to select an available stored computer entry. A keyboard can thus be eliminated without eliminating the keyboard function of entering a large number of pre-formed patterns including alphanumeric characters without analog formation by cursor manipulation. Also computer commands may be entered by cursor controlled key selections.

Arrays of as few as twelve or sixteen keys in a virtual keyboard display are provided in patterns that reduce significantly the amount of cursor movement, operator manipulation and time lapse in reproducing alphabetic data entries, to produce respectively 144 or 256 different entry selections desired for operation of multi-function alphanumeric computers.

The electronic virtual keyboard display pioneered by this invention gives considerable advantage in providing the operator with automatically updated information on the computer screen of the functions of specific keys whenever a change of key functioning occurs with a corresponding computer mode change. Thus, a virtual keyboard array is displayed on the screen to indicate the current key roles in operation at any time. The key roles thus may be changed automatically in a plurality of computer or keyboard operating modes. Of particular interest is the automatic display of the separate keyboard functions in effect for each of the two selections in a two-stroke-per-entry mode.

Particular advantage of this system is afforded in alphanumerically annotating diagrams or sketches formed in computer aided drafting and design systems. Thus, the mouse, or like cursor and pattern positioning means, need not be manipulated in analog fashion to form annotation characters or other pattern formats which are available in the computer as preformed alphanumeric characters and other patterns. Rather the mouse merely moves the cursor about an electronically generated virtual keyboard display on the screen, to select one of the keys identified with a symbol that identifies the desired key function. Keyboard keys are positioned in the virtual keyboard array for arraying alphabetic characters to minimize the movement of the mouse in selection of characters in a body of text, thereby permitting selection of such text in less time.

This invention thus introduces a virtual keyboard presented on the computer screen and an analog manual cursor position control device to replace a conventional keyboard.

BRIEF DESCRIPTION OF THE DRAWINGS

Throughout the various views of the drawings, like reference characters are used to indicate similar features, to facilitate comparison. The description which follows will refer to the accompanying drawing, wherein:

FIG. 3 is a chart of a twelve key keyboard array used in one embodiment of this invention with the displayed symbols for selection of some of the 144 available keyboard entries in the two-stroke-per-entry mode, FIG. 8 is a chart showing the two stroke sequence for alphanumeric selections in the keyboard embodiment of FIG. 7.

THE PREFERRED EMBODIMENT

Figure 1:
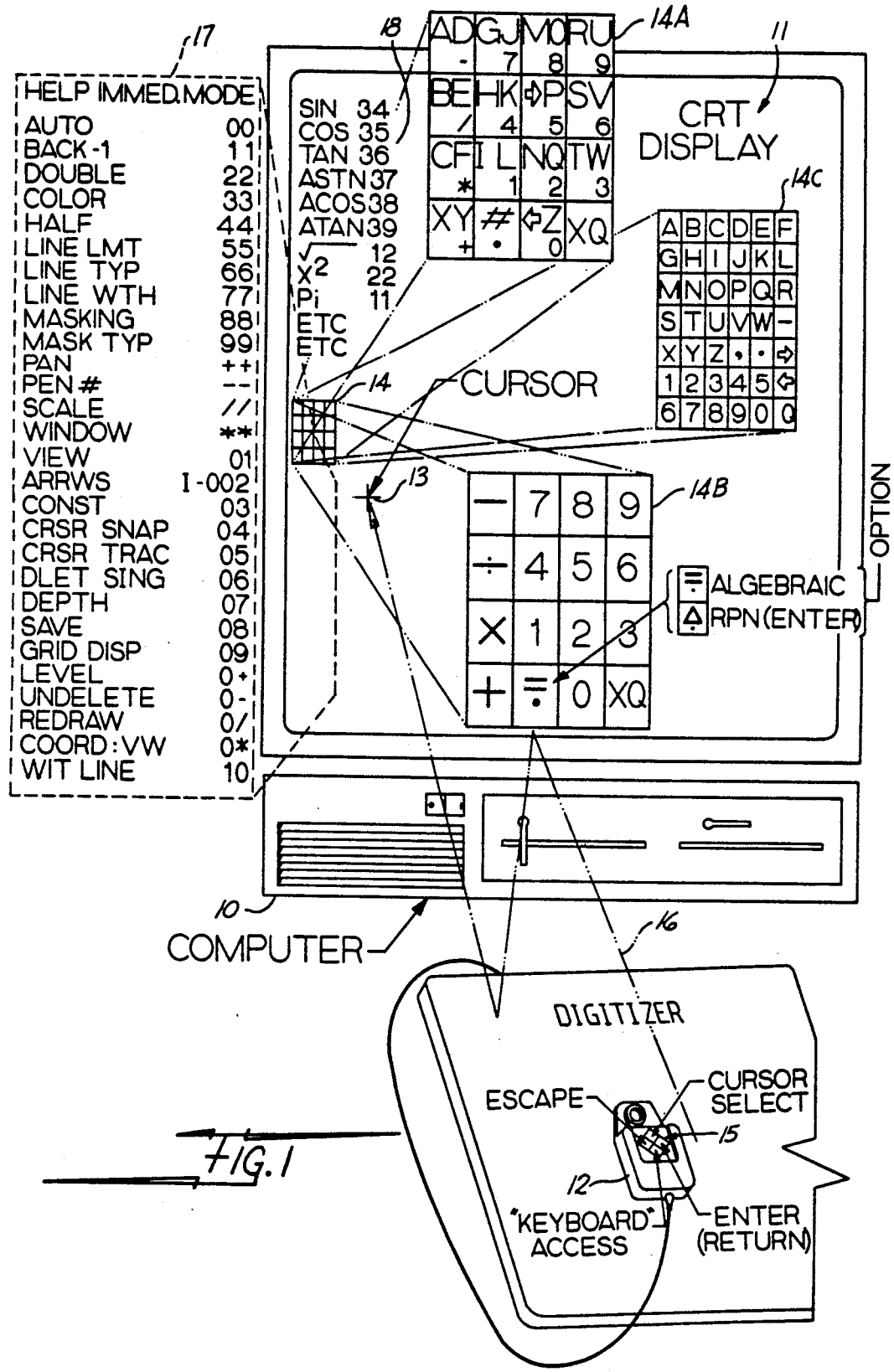
FIG. 1 is a sketch of a computer system embodying the invention wherein a mouse serves to make a keyboard selection from a virtual keyboard displayed on the computer screen.

As may be seen from FIG. 1, a computer 10 has a display screen 11 and a mouse 12 coupled for control of the position of the cursor 13. This assembly constitutes a computer aided design and drafting system, whereby sketches may be drawn on the computer screen by manipulation of the mouse 12, under control of conventional software and the instruction keyswitches 15 operable as the mouse is positioned to control the cursor position.

The improvement added by this invention is the ability to enter pre-formed patterns simply from the computer system, such as for example the alphanumeric characters desired to annotate or explain any design formed on the display screen. Thus, the computer 10 need have alphanumeric data processing capabilities, such as those usually manipulated by means of a conventional typewriter-like keyboard. The keyboard is however replaced in this invention by an electronically generated virtual keyboard 14 displayed upon the computer screen.

To stroke this initial keyboard displayed on the computer screen, only the mouse 12 is required. Thus the cursor 13 is physically positioned by movement of the mouse 12 to rest at one of the keys of the virtual keyboard 14 displayed on the screen. The individual keys are located in the chart subrectangles shown for convenience in enlarged form in the drawing by phantom lines linked to the virtual keyboard 14. After locating the cursor on a particular virtual key zone, one of the mouse keyswitches 15 then produces a keystroke to select the particular pattern or computer instruction available from the computer, as indicated by a corresponding symbol on the virtual keyboard 14 on the screen. The mouse could of course be some equivalent cursor positioning means, such as a joystick or a finger contacting the surface of the screen.

Two different sixteen key virtual keyboard configurations 14A and 14B are shown in enlarged view in a format provided for alphanumeric and numeric modes of computer operation. The numeric embodiment 14B is of the one-stroke-per-entry type, and the alphanumeric embodiment 14A is of the two-stroke-per-entry type.

The decimal point key is shown by the optional notation to have a dual function upon the second stroke within a decimal word, thereby to produce an algebraic operation or entry function, as set forth in my U.S. Pat. No. 4,567,567 of Jan. 28, 1986 for Computer Keyboard Displaying Many Operating Instructions with Few Keys.

Also, the 42 key keyboard configuration 14C could be used for simply alphanumeric character entries in response to a single-stroke-per-entry mode of operation. This does not give the 256 choices available from the fewer keys of the keyboard configuration 14A, however.

The phantom line 16 represents the function of the mouse 12, when used in accordance with this invention, in detemining the location of the cursor 13 to any desired position on the screen 11.

Other types of indicia aiding in keystroke selection of desired functions may be provided on the screen display as shown at the table 18 when the keyboard embodiment 14A is shown. Alternatively a "Help" mode may display such keystroke selection aids as the table 17.

The four selection keys 15 on the mouse 12 can be programmed for various functions. Four such typical functions are identified. Thus the "escape" key may be used for direct positive control of the escape function. In a corresponding manner the "enter" key can directly instruct the computer to indicate when a computer entry word or passage is completed and is to be stored. The "keyboard" access key will activate the keyboard mode. The "cursor select" key is the keystroking key in this configuration.

Figure 2:
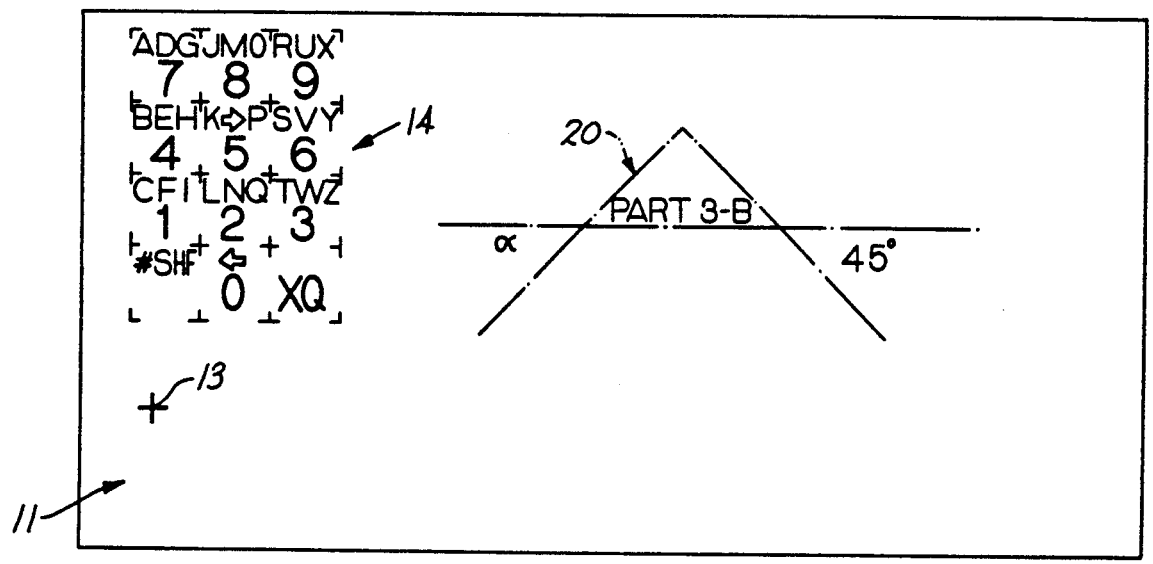
FIG. 2 is a sketch of a computer display screen for a computer aided drafting and design system constructed in accordance with this invention.

The screen 11 is shown diagrammically in FIG. 2, with an embodiment of the virtual keyboard 14 enlarged to substantially actual viewing size on a computer screen. This is a twelve key embodiment capable of digitizing alphamerically the preformed characters of a period or decimal point, the alphabet and decimal digits. Also other patterns, control functions and computer commands are feasible up to 144 selections with the keyboard operated in the two-stroke-per-entry mode as set forth in the parent cases hereto. That is the computer is operated internally in a keyboard entry mode to recognize as an entry from the keyboard two successive keystrokes to thereby identify one of the 144 entries possible with only twelve keys. The keyboard notation therefore in FIGS. 2 and 3 relate to this mode of operation and sets forth the symbols on the keyboard identifying some of the various patterns and computer commands available from storage in computer 10. The initial keyboard has displayed for the twelve keys the decimal digits 0 and 9, a period and an execute or enter key. These are the larger characters in FIG. 2, which also constitute the characters alongside the rectangles in FIg. 3.

The computer may be placed into a single-stroke-per-entry keyboard mode for numeric operations, and entry of the basic keyboard data with a single stroke, if desired. Then these keyboard symbols denote the key function. Otherwise, these decimal digits, etc. are only key names for aiding selection of the first key of the two requied, as will be made clear in the discussion of FIG. 2 hereinafter.

As seen from FIG. 2, the computer assisted drawing and design function can not only produce the triangular design 20, or other desired pattern by means of analog control of the mouse, but the design, in accordance with this invention, may enter appropriate annoted remarks in digital fashion using the prestored patterns selected from operation of the virtual keyboard. This is typified by the designation of one angle as "alpha", the other angle with "45 degrees" and noting the title "PART 3—B". The various notation digits are thus selected by means of the virtual keyboard from pre-formed patterns and need not be formed by analog mouse manipulation to draw a corresponding pattern or by the use of a conventional mechanical keyboard.

Figure 3:
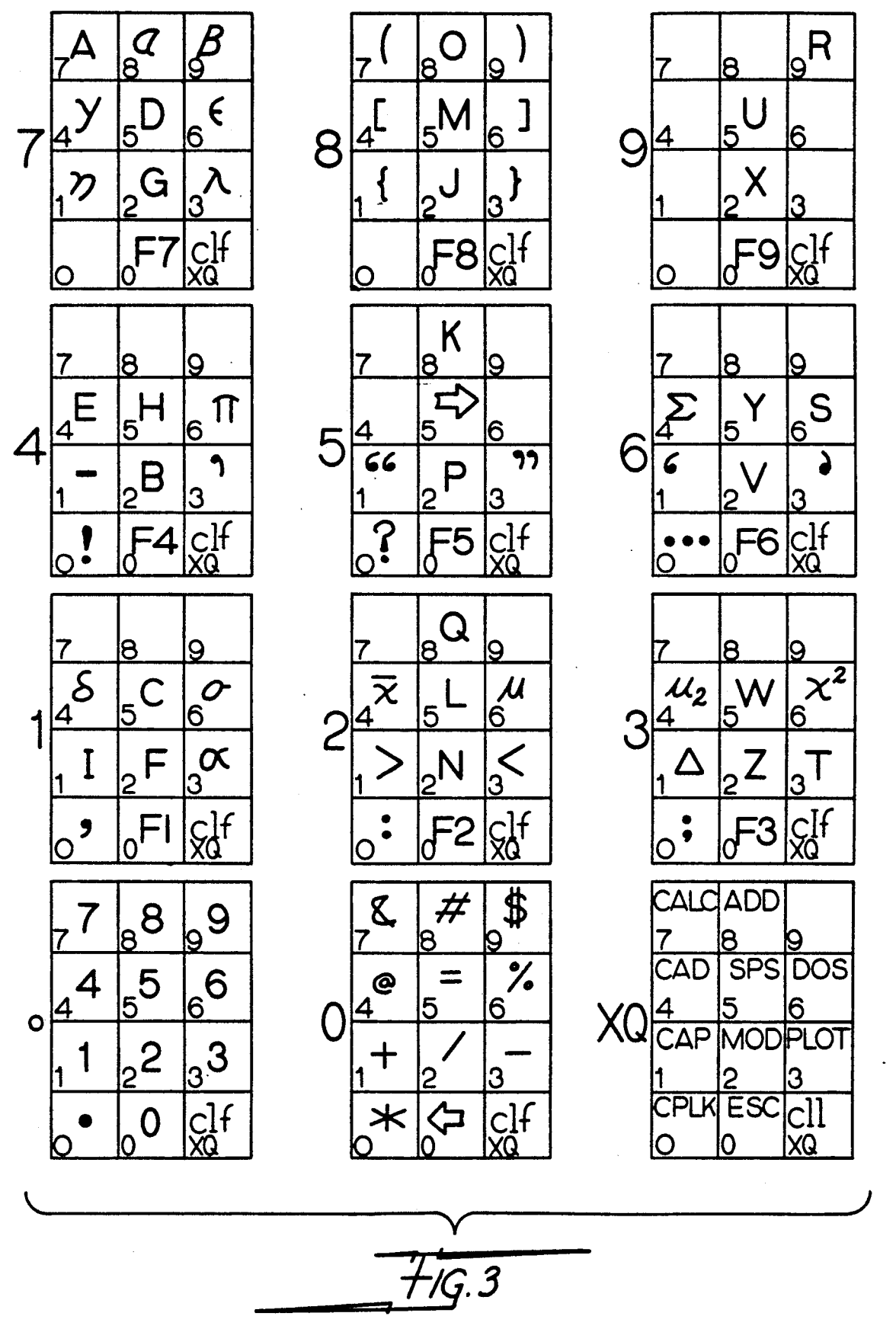

In accordance with another feature of the invention, the keyboard array 14 shown on screen 11 is changed automatically to correspond with the computer mode in effect at the time. That, now explained by example, illustrates a two-stroke-per-entry mode of operation for designating alphanumeric digital entries. That virtual keyboard array displayed on the screen in FIG. 2 thus is presented for a first keystroke, and one of those twelve rectangular keyboard arrays alongside the respective key names 0 to 9, etc., in FIG. 3 is reproduced automatically by the first keystroke selection on the screen 11 for identifying the functions performable by the second stroke.

As may be seen the letters A, D and G are available after striking 7 as a first key, as well as several other selections. Similarly after striking the period key, the decimal digits 0 to 9 are available, or after striking the execute key several computer commands are available. Note also that the execute key on the second stroke can be used to clear the first key stroke (clf) or by two strokes of XQ, the last key stroke can be cleared(cll).

In this particular layout of the alphabet the amount of movement of the cursor is minimized. Thus, for the more extensively used letters of the alphabet and spaces (used for every word), no second cursor movement is required. Thus A is selected by 7—7, E by 4—4, I by 1—1, O by 8—8, Space by 5—5, N by 2—2, R by 9—9, S by 6—6 and T by 3—3. By calculations from most frequently used letter tables, this means about 80% or normal typing is accomplished by use of these nine keys, where only one cursor movement is made to an initial key and a double stroke of the stroking key on the mouse completes the entry without moving the mouse. Other letters and symbols more frequently used are similarly placed to be reached by the shorter movements of the cursor from the initial key selection position to the second choice.

Note that this keyboard system corresponds to an alphanumeric mode of operation by the computer. An alternate keyboard system selected in a "drawing" mode, for example, might have a large range of geometric patterns available for use in synthesizing drawings or designs on the screen in a digital selection mode by the cursor rather than in an analog pattern formation mode. Thus, this system provides for the first time an efficient automated computer aided drafting and drawing system for keyboard-like selection of pre-formed patterns including alphanumeric characters by means of the cursor control mouse or equivalent means.

Figure 4:
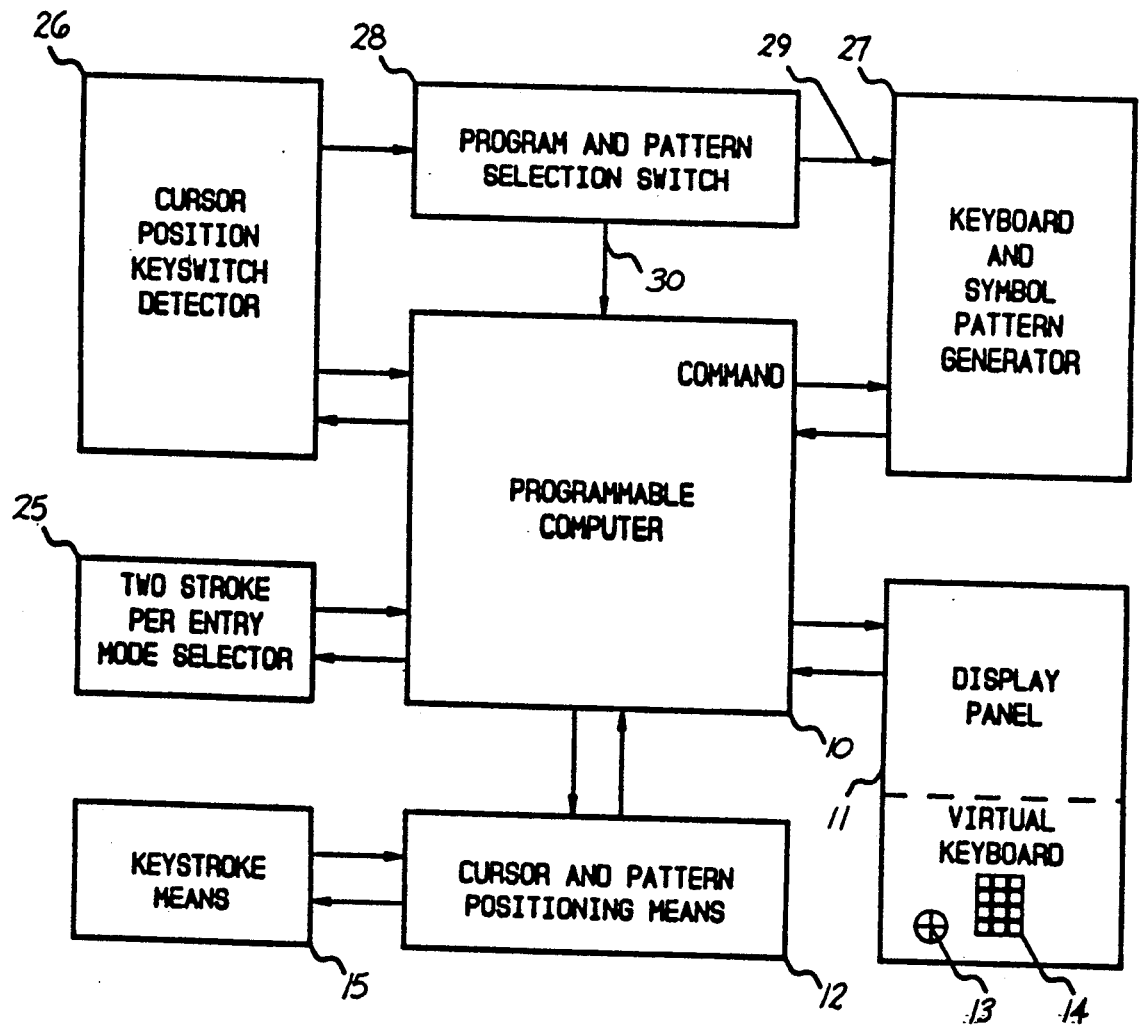
FIG. 4 is a block diagram of a computer system embodying the invention.

A computer system is organized as shown in the block diagram of FIG. 4 for the practice of this invention. In general, the multi-purpose programmable computer 10 is coupled in a conventional manner to the display panel 11 and cursor positioning means 12. In this respect, the system comprises a computer aided drawing and drafting system of the prior art.

There is however provided in accordance with this invention the virtual keyboard 14 on the display panel, and the operating system therefor. The two-stroke-per-entry mode selector 25 has been adequately described in the parent applications incorporated herein by reference. That feature in combination herein makes feasible the use of more comprehensive libraries of pre-determined commands and of pre-formed patterns for selection, and for the first time make possible the use of a mouse, or the like, to replace the conventional keyboard for manual input of alphanumeric data, with corresponding advantages of simplicity and high speed manual data input. That is, as hereinbefore described, very little movement of the mouse is needed to make a very large range of manual input selections.

It is known in the computer art to detect the position of a cursor on a screen, and to thereby control a subsequent computer operation in response to the detected cursor position. In menu driven computer programs, for example, a cursor notation, selected by cursor means such as a moving block or pointer is frequently used to select the next operation sequence to be taken by the computer. Such a cursor position detector 26 is employed herein for the different combinational interaction required in replacing a conventional keyboard with the virtual keyboard 14, which is merely an electronic pattern generated on the face of the screen 11 by a pattern generator 27, rather than a set of keyswitches requiring manual keystrokes, in the same manner as a typewriter. The illumination of the keyboard on the screen always provides optimum visibility without supplemental illumination, as required for mechanical keyboards.

Thus the keyboard pattern, and the corresponding key symbols identifying the respective key functions, are developed on the computer screen and stored in the computer memory in the same manner as the patterns of conventional screen displays in various computer systems. In the particular twelve keyswitch example hereinbefore described, the cursor position detector need identify the key selected by the cursor in the keyboard mode by identifying one of the twelve areas on the keyboard designated a keyswitch for each keystroke of a two keystroke sequence. Then the programming and pattern selection switch 28, in this case a one of 144 selection switching system, will recall the corresponding stored pre-formed pattern via lead 29, or initiate the appropriate computer command via lead 30. Accordingly those skilled in the art may in existing computer systems adopt this invention with simple changes in computer system organization and using conventional type techniques.

Figure 5:
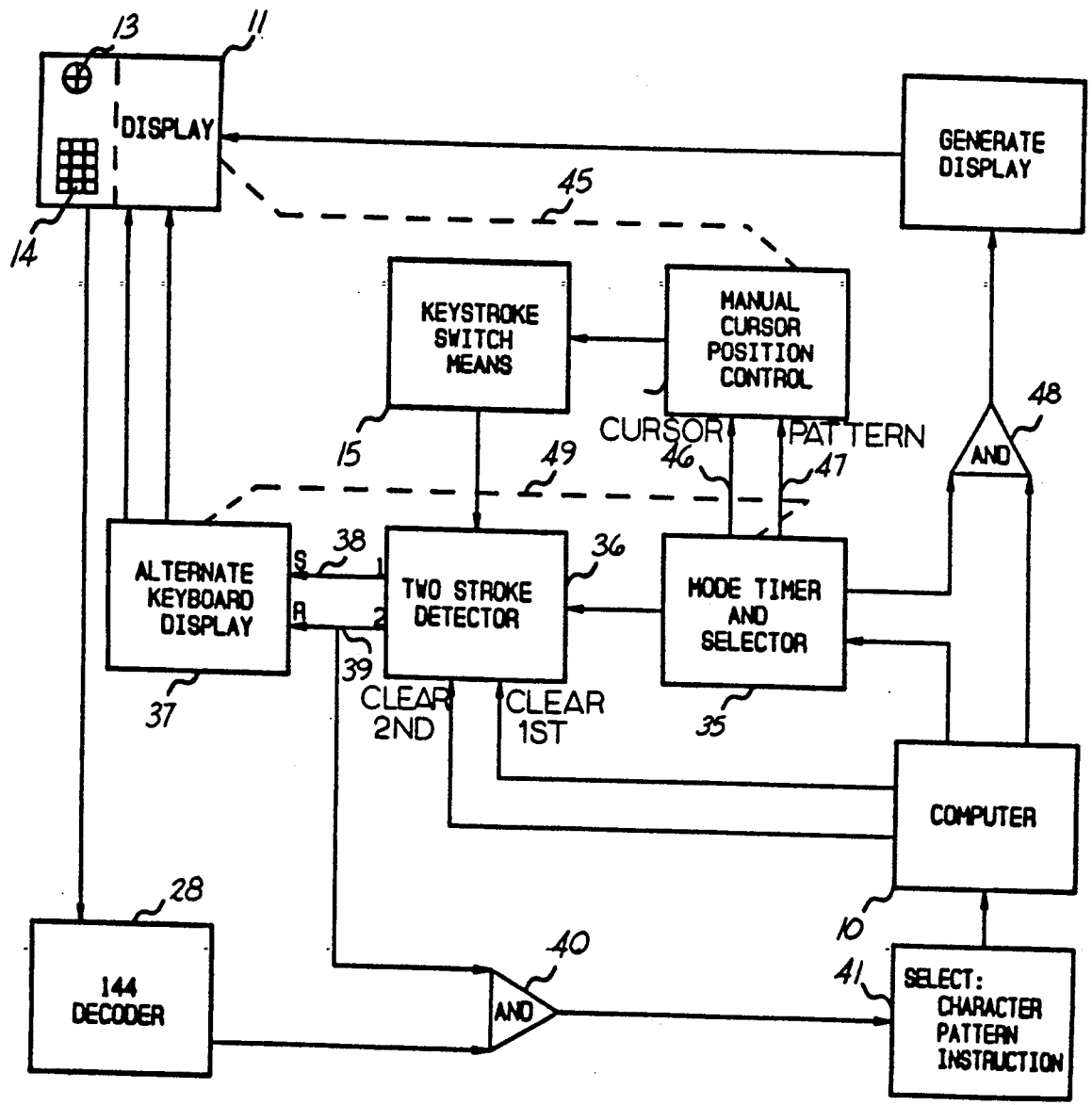
FIG. 5 is a data flow diagram in block format illustrating the mode of operation of a computer embodying this invention.

To better understand the flow of data and control signals in the computer system afforded by this invention, reference is made to the block flow diagram of FIG. 5. This particular diagram is directed to a system employing a two-keystroke-per-entry mode of operation to place two different virtual keyboards 14 on the screen automatically as the alternate computer modes for the first keystroke and the second stroke are established by the mode timer and selector 35, via two stroke detector means 36, which could simply be a toggle or flip-flop circuit.

Thus when the mode selector 35 is in the keyboard mode for alphanumeric selections of the type hereinbefore discussed, then two alternate keyboard arrays are to be selected for display by the selector 37, responsive to the keystrokes from the mouse mounted switching means 15. The first keystroke serves at the set output lead 38 of the two stroke detector 36 to display the second virtual keyboard array 14 on the screen 11. The second successive keystroke of the entry cycle will then reset the key display to the proper array for the first keystroke of the next entry via lead 39. Also that second keystroke will via AND circuit 40 and the code selector switching circuit 28 operated by the two selected keystrokes by means of the cursor position detector (26, FIG. 4) selects a pre-formed character pattern or instruction from the computer store by way of block 41. Thus a selected pattern such as an alphanumeric character will be formed on the display 11, as if it were chosen from a conventional manually stroked keyswitch array.

The dotted cursor position control line 45 signifies the means for choosing the key to be stroked by keystroke switch means 15 in the cursor movement mode of mode selector 35 as indicated at lead 46. Once a pattern is selected, it may be moved into a desired position on the screen in the same manner by the mouse, as indicated by the pattern positioning mode lead 47. The computer thus, via AND circuit 48 will select a mode for generation of the digital pre-stored patterns, or the analog drawing of patterns by the mouse means 12. Note also that the computer mode selector 35 will be way of the dotted line communication link 49 set up any corresponding keyboard-symbol array and corresponding pattern and instruction repertoire that should be used in that mode, such as for example, the one stroke per entry numerical mode previously discussed.

Figure 6:
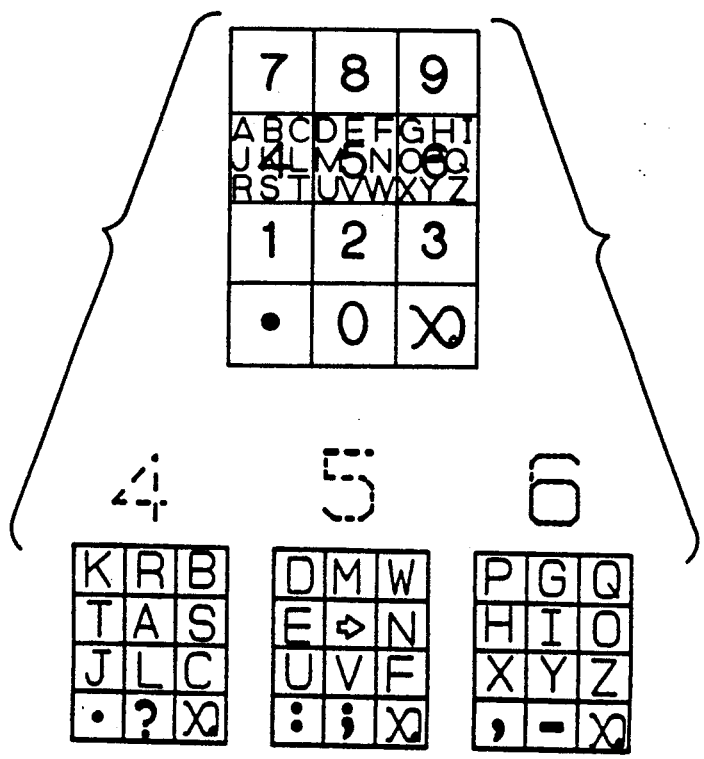
FIG. 6 is a further keyboard array sketch embodiment of the invention for a twelve key keyboard array.

Alternative keyboard arrays may be advantageous under certain circumstances, such as that shown in FIG. 6, wherein the alphabetic selections are confined within the range of the 4, 5, and 6 initial selection keys. For example, with only three keys necessary, the available switches (15) on the mouse can be programmed to make the first key selection, thus effectively saving one of the two cursor movements necessary.

Figure 7:
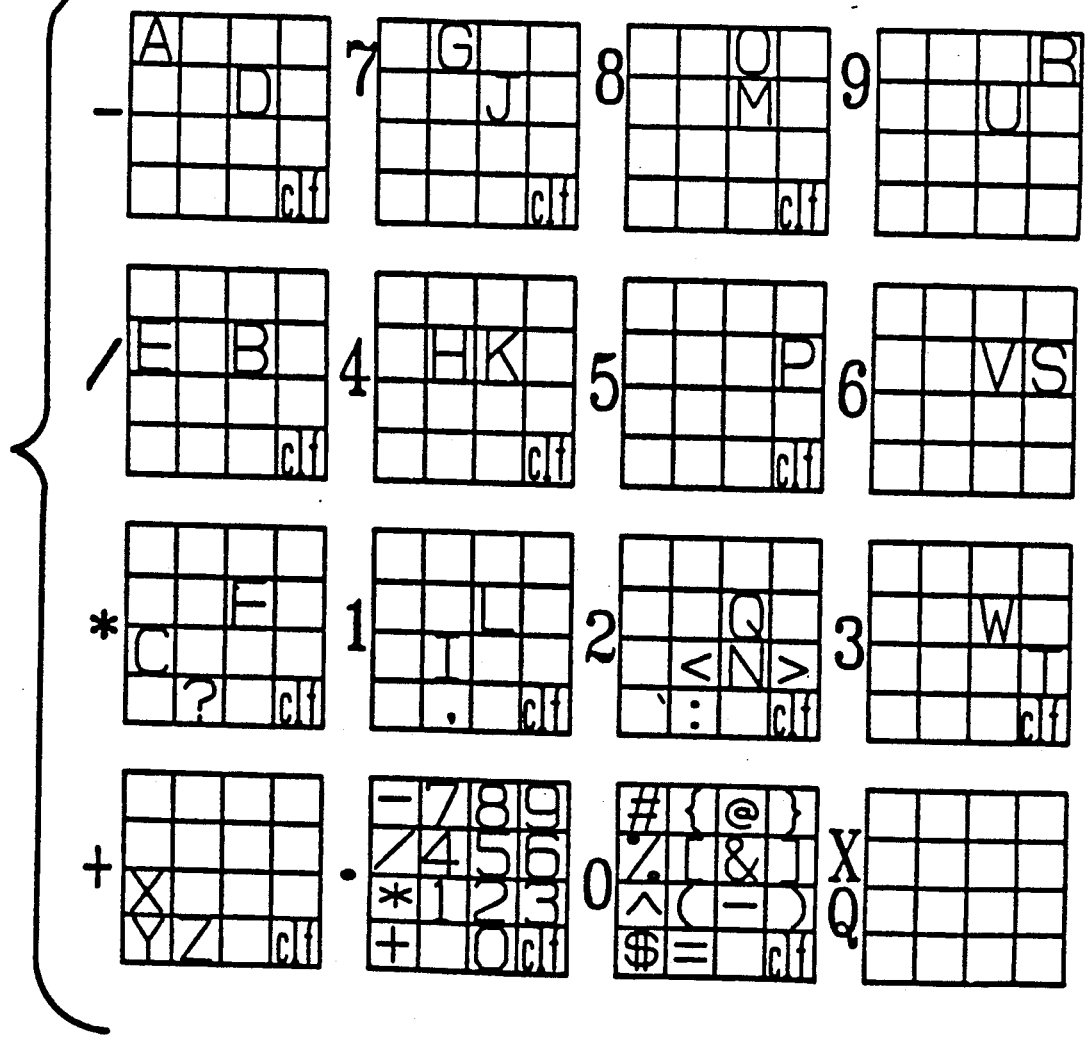
FIG. 7 is a keyboard layout for a sixteen key keyboard array provided in a preferred embodiment of the invention.

With an array of sixteen keys as set forth in the two-stroke-per-entry mode, 256 selections are afforded. On high resolution computer screens, this keyboard array (14A) is quite legible in a one-inch square pattern, as set forth at 60 in FIG. 7, representing a foreshortened set of symbols useful for the alphanumeric mode of operation. The lowermost symbol 61 for each virtual key represents the key "name" taken from a numeric single stroke keyboard configuration (14B), which includes some arithmetic operations as shown in the leftmost column. Two alphabet characters 62, etc are disposed in each of the sixteen second keystroke arrays (shown with the key names to the left), except for the X, Y, Z virtual key 63. That permits all the numerical digits to be on the period key second stroke, the miscellaneous punctuation symbols on the "0" key and computer command functions, such as mode changes, on the XQ key. Also more important, the sixteen different more frequently used alphabetic characters each can be selected by a double keystroke without moving the cursor position.

The chart of FIG. 8 lays out for the major symbols of a typewriter keyboard seleciton, the two successive keystrokes required, showing the minimization of the cursor movement, and the convenience of numeric selection by the primary key number position after preselection of the period key in each instance.

This invention therefor provides a computer system that replaces the conventional typewriter-type keyboard with a simpler analog manual entry cursor positioning means, such as a mouse. This analog selection means is used in one mode to generate patterns on the computer screen manually by analog movement and by this invention is used in the analog cursor postioning mode to select from a large number of pre-formed patterns and computer commands displayed on a keyboard simulating chart presented on the computer screen, thereby to operate in a keyboard type digital entry mode without the necessity of providing a separate digitally fingered keyboard.

Having therefore set forth the nature and organization of this invention in its preferred embodiments, those features of novelty believed descriptive of the spirit and nature of the invention are set forth with particularity in the following claims.

I claim:

1. In a computer system operable with selection control means for placing a cursor position on a visible display screen for displaying graphic patterns,
    means for displaying on a portion of said screen a virtual keyborad array presenting a plurality of virtual keys at respective keyboard locaitons having thereat symbols identifying both a set of computer reproducible patterns and a set of computer command instructions to be selected by moving the cursor to identify the respective virtual keys,
    manually positionable keystroking means responsive to the cursor position on said display screen for selecting a desired one of the virtual keys on said screen and initiating a computer command operation corresponding to a symbol identified at the selected virtual key loation displayed on the screen.
    means for operating the computer in a mode requiring two keystrokes per entry thereby to reduce the number of virtual keys and corresponding display space required on the computer screen for selection of said sets of patterns and commands, and
    means for displaying one set of virual key configurations on the screen for the first keystroke showing the key function and activating the keys to operate to perform that function, and for replacing the key configuration with another set of virtual keys with displayed key functions on the screen for the second keystroke in response to the first keystroke.

2. The system of claim 1 wherein said means for displaying on a portion of said screen a virtual keyboard array provides a set of patterns reproducible by said compute system and displayed on the virtual keyboard identifying selections from respective virtual keys in said two keystroke sequence, and
    means for arranging the two keystroke sequence on the respective keys for selecting a set of the most frequently used patterns without movable repositioning the manual keystroking means for the second keystroke.

3. The system of claim 2 further comprising, means for establishing as patterns in said set of most frequently used patterns selected letters of the alphabet.

4. The system of claim 2 further comprising no more than sixteen virtual keys in the virtual keyboard array.

* * * * *